| (12) United States Patent | (10) Patent No.: US 7,480,839 B2 |
| Smith et al. | (45) Date of Patent: Jan. 20, 2009 |

(54) QUALIFIED ANOMALY DETECTION

(75) Inventors: Patrick A. Smith, Beaverton, OR (US); Roland E. Wanzenried, North Plains, OR (US)

(73) Assignee: Tektronix, Inc., Beaverton, OR (US)

( * ) Notice: Subject to any disclaimer, the term of this patent is extended or adjusted under 35 U.S.C. 154(b) by 393 days.

(21) Appl. No.: 11/298,200

(22) Filed: Dec. 8, 2005

(65) Prior Publication Data

US 2007/0150776 A1 Jun. 28, 2007

(51) Int. Cl.
G01R 31/28 (2006.01)

(52) U.S. Cl. .................... 714/715; 714/25; 714/39; 714/707; 714/709; 714/714; 714/724; 714/744; 714/814; 714/815; 714/819; 702/125; 702/67; 370/241; 324/76.11

(58) Field of Classification Search ............... None
See application file for complete search history.

(56) References Cited

U.S. PATENT DOCUMENTS

| 4,811,366 | A | * | 3/1989 | Kage ..................... 375/367 |
| 4,823,076 | A | * | 4/1989 | Haines et al. ............ 324/121 R |
| 5,706,203 | A | * | 1/1998 | Kawauchi .................... 702/66 |
| 5,974,104 | A | * | 10/1999 | Dhara ..................... 375/368 |
| 6,658,363 | B2 | * | 12/2003 | Mejia et al. .................. 702/125 |
| 6,807,496 | B2 | * | 10/2004 | Pickerd ..................... 702/67 |
| 6,850,852 | B1 | * | 2/2005 | Ferguson et al. ............. 702/67 |
| 6,990,416 | B2 | * | 1/2006 | Kobalka et al. .............. 702/67 |
| 7,120,121 | B2 | * | 10/2006 | Sikdar ..................... 370/241 |
| 2003/0033559 | A1 | * | 2/2003 | Williams .................... 714/39 |
| 2003/0220753 | A1 | * | 11/2003 | Pickerd et al. ............... 702/67 |
| 2005/0225310 | A1 | | 10/2005 | Smith | |

FOREIGN PATENT DOCUMENTS

| EP | 1314987 A1 | * | 11/2002 |
| EP | 1314987 A | | 5/2003 |
| GB | 2375465 A | | 11/2002 |

\* cited by examiner

*Primary Examiner*—John P Trimmings
(74) *Attorney, Agent, or Firm*—Francis I. Gray; Thomas F. Lenihan

(57) ABSTRACT

A circuit and method of qualified anomaly detection provides detection and triggering on specific analog anomalies and/or digital data within a qualified area of a serial data stream. A start pattern within the serial data stream, such as a packet header, is detected to generate an enable signal. A stop event, such as a packet trailer, a specified digital event, a time interval or the like, is identified to generate a disable signal. The enable and disable signals are combined to produce a qualification signal that allows a trigger circuit to trigger on a specified anomaly within the portion of the serial data stream defined by the qualification signal.

20 Claims, 2 Drawing Sheets

QUALIFIED ANOMALY DETECTION

BACKGROUND OF THE INVENTION

The present invention relates to analysis of digital data, and more particularly to a method of qualified anomaly detection in order to detect and trigger on specific analog anomalies and/or digital data within a qualified area of a serial data stream.

Oscilloscope trigger circuits have become exceedingly complex, enabling a user to trigger on almost any type of analog anomaly within an input electrical signal in order to acquire data for the analysis of the particular anomaly. Some trigger circuits also allow the user to trigger on a particular data word or event within a serial digital data stream. However serial data streams encompass many levels of hierarchy, as exemplified by the OSI (Open System Interconnection) model that defines a networking framework for implementing protocols in seven layers. These serial data streams have framed data accompanied by several higher layer protocols that are used to route/identify the data. This makes debugging of a physical event or anomaly within a specific portion of the serial data stream difficult. Since these serial data streams tend to be quite noisy, analog anomalies may be particularly problematic when the serial data streams are decoded for information content. Such anomalies may result in misinterpretation of the bits within the serial data stream.

Logic analyzers have the capability to trigger on anomalies if they have digital characteristics and thresholds only, but do not have the ability to trigger on analog anomalies representative of signal fidelity.

What is desired is a method of detecting and triggering on specific analog anomalies and/or digital data within a qualified area of the serial data stream.

BRIEF SUMMARY OF THE INVENTION

Accordingly the present invention provides a method of qualified anomaly detection that provides detection and triggering on specific analog anomalies and/or digital data within a qualified area of a serial data stream. A start pattern within the serial data stream, such as a packet header for a packetized data stream or other identifiable event, is detected to generate an enable signal. A stop event, such as a packet trailer, a specified digital event, a time interval or the like, is identified to generate a disable signal. The enable and disable signals are combined to produce a qualification signal that allows a trigger circuit to trigger on a specified anomaly within the portion of the serial data stream defined by the qualification signal.

The objects, advantages and other novel features of the present invention are apparent from the following detailed description when read in light of the appended claims and attached drawing.

DETAILED DESCRIPTION OF THE INVENTION

Figure 1:
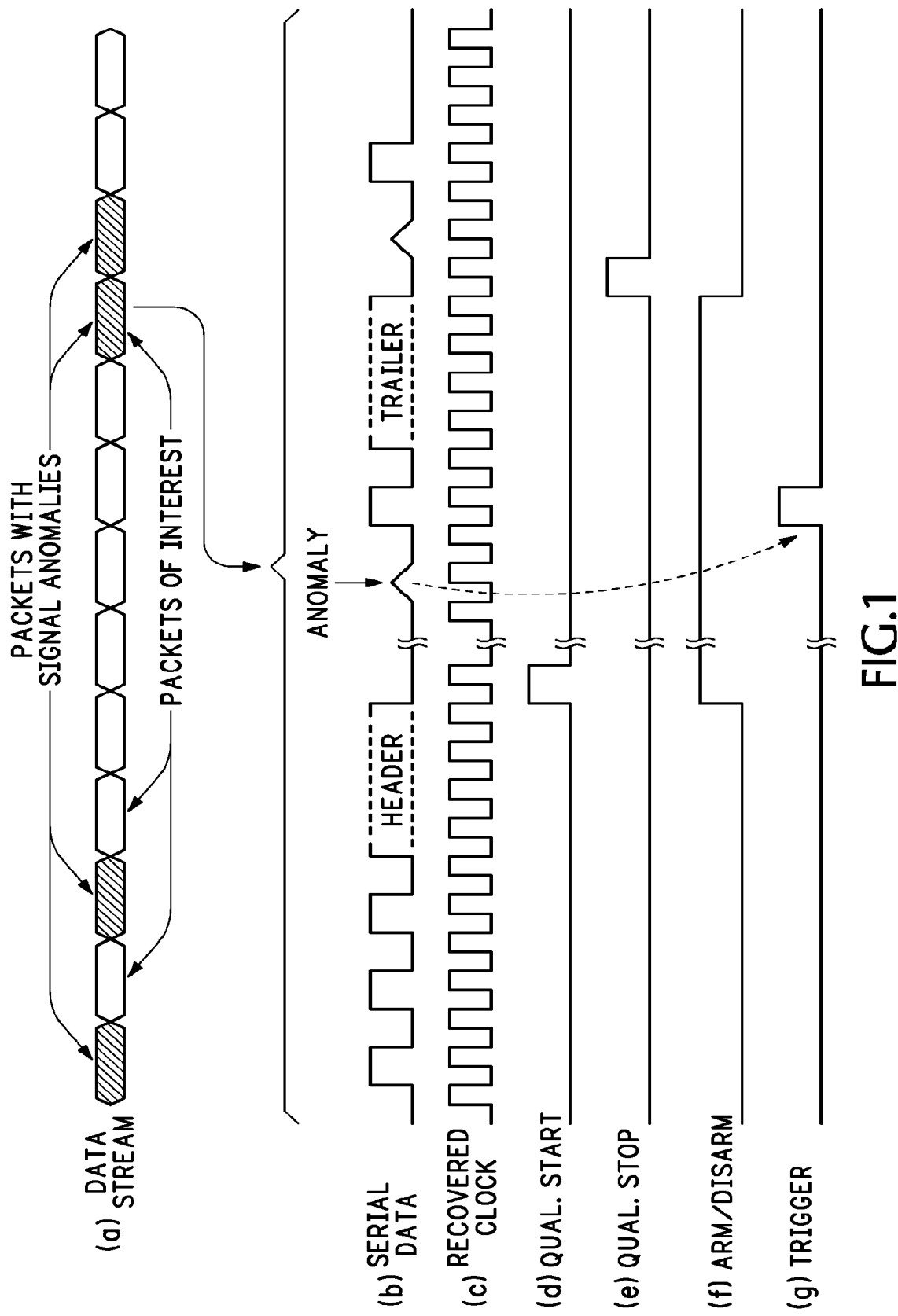
FIG. 1 is an event timing diagram view illustrating qualified anomaly detection according to the present invention.

Referring now to FIG. 1 (*a*) a serial data stream, such as a SONET data stream, is shown having a plurality of data packets in a sequence. As indicated some of the data packets have signal anomalies present within them. The user is only interested in certain data packets or portions of the serial data stream, and so is interested in capturing data surrounding an anomaly within any of the data packets or portions of interest. The remainder of FIG. 1 shows the timing within the data packet of interest indicated as having an anomaly. The process described below applies to each of the data packets or portions of interest, but only the anomalous data packet or portion of interest produces a trigger signal.

As shown (*b*) the serial data is a series of alternating signal levels corresponding to logic levels, such as "0" or "1." Within the serial data is a group of "bits" that have a unique pattern indicating the beginning of a particular portion of the serial data of interest, i.e., a header may be used for packetized data as in this example. Likewise within the serial data is a group of "bits" that have a unique pattern indicating the end of the particular portion of the serial data of interest, i.e., a trailer may be used for packetized data as in this example. Within this portion of the serial data between the header and trailer, or start event and stop event, the user is looking for any anomalies that might cause an error when the serial data is decoded. A (*c*) clock recovered from the serial data, or an external clock that is comparable to the recovered clock, is used for timing. At the end of the header or start event (*d*) a qualification start signal is generated and at the end of the trailer or stop event (*e*) a qualification stop signal is generated. The interval between the qualification start and stop produces (*f*) an arm signal that enables a trigger circuit in order to acquire data within the armed interval that represents a specified anomaly. When the specified anomaly occurs, such as a runt, glitch, spike, serial pattern, etc., the trigger circuit generates (*g*) a trigger signal that causes data surrounding the specified anomaly to be captured for analysis, as is well known in the art.

Figure 2:
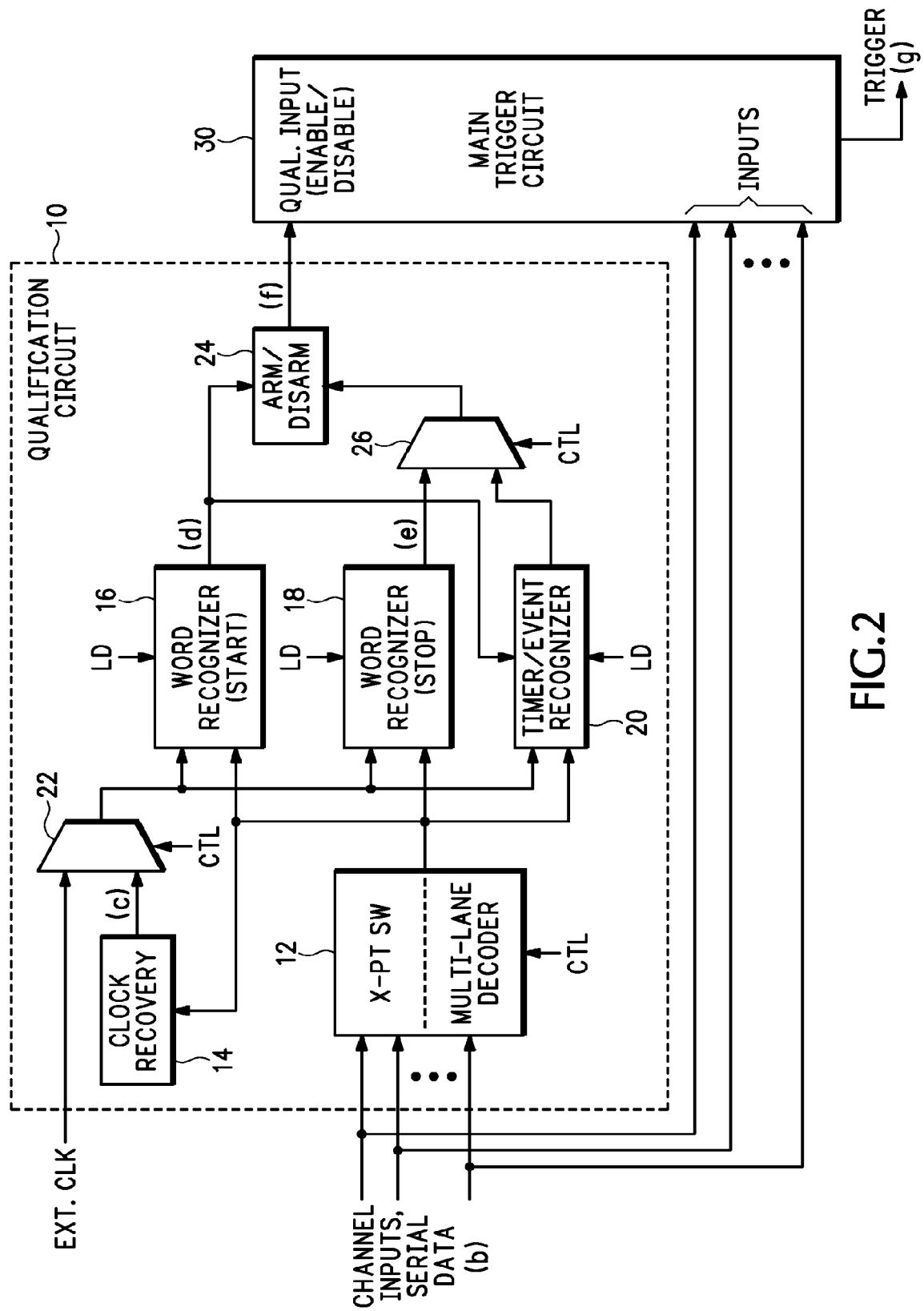
FIG. 2 is a block diagram view of an apparatus for qualified anomaly detection according to the present invention.

As shown in FIG. 2 various channel inputs carrying serial data streams, or a multi-lane serial data stream, are input both to a qualification circuit 10 as described below and to a conventional main trigger circuit 30. The qualification circuit 10 receives the serial data streams from the input channels at a cross-point switch 12 which routes one of the input channels to an output. The cross-point switch 12 also provides the ability to convert a multi-lane data stream across multiple inputs into a single serial data stream at the output. The selected serial digital stream from the cross-point switch 12 is input to a clock recovery circuit 14, a start word recognizer 16, a stop word recognizer 18 and a timer/event recognizer 20. The embedded clock in the serial data stream is recovered by the clock recovery circuit 14 and used to provide timing for the various recognizers 16, 18, 20. Alternatively an external clock that is equivalent to the embedded clock may be selected in lieu of the recovered clock by a clock multiplexer 22 for use as the timing source. The respective word recognizers 16, 18 look at respective unique data patterns indicating a starting point in the selected serial data stream and a stopping point in the selected serial data stream that define the portion of the serial data stream of interest. The data stream is clocked into each of the word recognizers 16, 18 by the recovered clock. In the simplest form the output from the start word recognizer 16 is input to an arm/disarm circuit 24 to cause the output from the arm/disarm circuit to provide an enable signal to the main trigger circuit 30, at which point the main trigger circuit starts looking for the specified anomaly in the channel input(s). The output from the stop word recognizer 18 also is input to the arm/disarm circuit 24 to cause the output from the arm/disarm circuit to provide a disable signal to the main trigger circuit 30, at which point the main trigger circuit stops looking for the specified anomaly in the channel input(s).

Alternatively the output from the start word recognizer 16 may be used to enable the timer/event recognizer 20 to provide the disable signal via a stop multiplexer 26 to the arm/disarm circuit 24. As a timer the timer/event recognizer 20 is reset or initiated by the output from the start word recognizer 16 and counts the recovered clock pulses until a specified time period ends, at which point the timer/event recognizer outputs the disable signal. The timer may be either an up-counter or a down-counter. As an event recognizer the timer/event recognizer 20 looks for a specified pattern in the selected serial data stream as a terminal event that generates the disable signal. The stop multiplexer 26 may also be implemented using OR logic so that if either the trailer or specified event occurs, the disable signal is generated for the arm/disarm circuit 24.

As a specific example if a trigger on a runt or glitch that occurs within a data packet having a specific header is desired, a packet header for the selected serial data stream is programmed as the trigger enable signal while a packet trailer is programmed as the trigger disable signal. If the runt or glitch occurs in the packet between the header and trailer, the trigger circuit generates a trigger to capture the surrounding data for analysis.

Although the above description relates in detail to a packetized communications standard, the described invention is unrelated to any particular standard. For example, not all standards are packetized. Some standards may have a particular pattern that repeats multiple times, but only after a certain number of iterations is actual information data transmitted. In this case the number of iterations of the identified pattern is counted as part of the start pattern that determines when the trigger circuit is qualified to start looking for analog anomalies in the serial data stream. Other standards may have periodic dead times, which dead times could be identified and a time after the end of the dead time specified as the start event for qualifying the trigger circuit. Therefore any identifiable pattern or sequence of patterns in the serial data stream may be identified as the start event depending on the particular data standard used for the serial data stream.

Thus the present invention simplifies the triggering in a serial data stream by recognizing a specified start pattern before enabling a physical trigger circuit, and then recognizing a specified stop pattern, event or time period to disable the trigger circuit.

What is claimed is:

1. A method of qualifying a trigger event comprising the steps of:
   detecting a start pattern in a serial data stream to provide an enable signal for a trigger circuit; and
   identifying a predetermined data pattern indicative of a stop event after the start pattern to provide a disable signal for the trigger circuit so that the trigger circuit provides a trigger signal only when the trigger event occurs in the serial data stream between the start pattern and the stop event.

2. The method as recited in claim 1 wherein the identifying step comprises the step of detecting a stop pattern in the serial data stream as the stop event.

3. The method as recited in claim 2 wherein the stop pattern comprises a packet trailer indicating the end of a data packet of interest within the serial data stream.

4. The method as recited in claim 1 wherein the identifying step comprises the step of detecting a specified pattern in the serial data stream as the stop event.

5. The method as recited in claim 1 wherein the identifying step comprises the step of generating the stop event at a specified time interval after the start pattern.

6. The method as recited in any of claims 1-5 wherein the start pattern comprises a packet header indicating the start of a data packet of interest within the serial data stream.

7. A trigger qualification circuit comprising:
   means for detecting a start pattern in a serial data stream to provide an enable signal for a trigger circuit;
   means for identifying a predetermined data pattern indicative of a stop event after the start pattern to provide a disable signal for the trigger circuit so that the trigger circuit is enabled to provide a trigger signal only in the interval between the start pattern and the stop event.

8. The trigger qualification circuit as recited in claim 7 further comprising means for selecting the serial data stream from among a plurality of inputs for input to the detecting and identifying means.

9. The trigger qualification circuit as recited in claim 8 wherein the selecting means comprises means for generating the serial data stream from the plurality of inputs representing a multi-lane serial data stream.

10. The trigger qualification circuit as recited in claim 9 wherein the selecting means comprises a cross-point switch having a plurality of input ports for receiving the plurality of inputs and having an output port for providing the serial data stream to the detecting means.

11. The trigger qualification circuit as recited in claim 7 wherein the identifying means comprises means for combining the enable and disable signals to provide a qualification signal to the trigger circuit during the interval between the start pattern and the stop event.

12. The trigger qualification circuit as recited in claim 11 wherein the combining means comprises an arm/disarm circuit having the enable and disable signals as inputs and providing the qualification signal as an output.

13. The trigger qualification circuit as recited in claim 7 wherein the identifying means comprises means for detecting a stop pattern in the serial data stream as the stop event.

14. The trigger qualification circuit as recited in claim 13 wherein the stop pattern comprises a packet trailer indicating the end of a data packet of interest within the serial data stream.

15. The trigger qualification circuit as recited in claim 14 wherein the stop pattern detecting means comprises a stop word recognizer for comparing the serial data stream with the stop pattern that is preloaded in the stop word recognizer to produce the disable signal.

16. The trigger qualification circuit as recited in claim 7 wherein the identifying means comprises means for detecting a specified pattern in the serial data stream as the stop event.

17. The trigger qualification circuit as recited in claim 16 wherein the specified pattern detecting means comprises an event recognizer for comparing the serial data stream with the specified pattern that is preloaded in the event recognizer when enabled by the enable signal from the start pattern detecting means to produce the disable signal.

18. The trigger qualification circuit as recited in claim 7 wherein the identifying means comprises means for generating the stop event at a specified time interval after the start pattern.

19. The trigger qualification circuit as recited in claim 18 wherein the generating means comprises a timer that is enabled by the enable signal from the start pattern detecting means and that provides the disable signal as an output after the specified time interval.

20. The trigger qualification circuit as recited in any of claims 7-19 wherein the start pattern comprises a packet header indicating the start of a packet of interest within the serial data stream.

\* \* \* \* \*